United States Patent
Lee et al.

(10) Patent No.: US 7,579,237 B2
(45) Date of Patent: Aug. 25, 2009

(54) NONVOLATILE MEMORY DEVICE AND METHOD OF MANUFACTURING THE SAME

(75) Inventors: Sang-Kyoung Lee, Incheon-Gwangyeoksi (KR); Jin-Hong Kim, Suwon-si (KR); Dong-Hwan Kim, Suwon-si (KR); Won-Sik Shin, Seoul (KR); Woong Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 87 days.

(21) Appl. No.: 11/653,362

(22) Filed: Jan. 16, 2007

(65) Prior Publication Data

US 2008/0090352 A1    Apr. 17, 2008

(30) Foreign Application Priority Data

Oct. 16, 2006 (KR) .................. 10-2006-0100433

(51) Int. Cl.
*H01L 21/336* (2006.01)
(52) U.S. Cl. .............. 438/257; 438/255; 438/258; 438/259; 438/260; 438/262; 438/264; 257/E21.209; 257/E21.682
(58) Field of Classification Search .......... 438/260, 438/262, 267
See application file for complete search history.

(56) References Cited

U.S. PATENT DOCUMENTS

| 6,927,447 B2 | 8/2005 | Choi et al. |
| 7,297,600 B2 | 11/2007 | Oh et al. |
| 2002/0185674 A1* | 12/2002 | Kawashima et al. ........ 257/315 |
| 2003/0057473 A1 | 3/2003 | Kamiya et al. |
| 2005/0277248 A1 | 12/2005 | Kim et al. |
| 2005/0287777 A1* | 12/2005 | Morino et al. .............. 438/510 |
| 2006/0081916 A1 | 4/2006 | Sohn et al. |

FOREIGN PATENT DOCUMENTS

| KR | 10-2003-0042315   | 5/2003 |
| KR | 10-2004-0011656 A | 2/2004 |
| KR | 10-2005-0116073 A | 12/2005 |
| KR | 10-2005-0118823   | 12/2005 |
| KR | 10-2006-0023489 A | 3/2006 |

* cited by examiner

*Primary Examiner*—N Drew Richards
*Assistant Examiner*—Kyoung Lee
(74) *Attorney, Agent, or Firm*—Lee & Morse, P.C.

(57) ABSTRACT

A method of manufacturing a nonvolatile memory device includes forming a plurality of device isolation regions in a semiconductor substrate, forming a tunneling insulation layer on the semiconductor substrate, forming a first preliminary polysilicon layer in communication with the tunneling insulation layer and the device isolation regions, forming a preliminary amorphous silicon layer on the first preliminary silicon layer, forming a second preliminary polysilicon layer on the preliminary amorphous silicon layer, and patterning the second preliminary polysilicon layer, the preliminary amorphous silicon layer, and the first preliminary polysilicon layer to form a floating gate layer.

20 Claims, 5 Drawing Sheets

NONVOLATILE MEMORY DEVICE AND METHOD OF MANUFACTURING THE SAME

BACKGROUND OF THE INVENTION

1. Field of the Invention

The present invention disclosed herein relates to a semiconductor device and a method of manufacturing the same. More particularly, the present invention relates to a semiconductor nonvolatile memory device exhibiting improved electrical operation and a method of manufacturing the same.

2. Description of the Related Art

In general, semiconductor memory devices may be classified into volatile memory devices and nonvolatile memory devices. The volatile memory devices may need power supply to retain data, while the nonvolatile memory devices, e.g., a flash memory device, may retain data without power. The flash memory device may refer to a highly-integrated nonvolatile memory device that may include both an erasable programmable read only memory (EPROM) and an electrically erasable programmable read only memory (EEPROM).

The conventional flash memory device may need a p-type floating gate layer for excellent RTS (room temperature storage) characteristics. In particular, the p-type floating gate layer may facilitate formation of a depletion region between the p-type floating gate layer and a tunneling insulation layer, thereby minimizing electron leakage from the floating gate layer through the tunneling insulation layer into a semiconductor substrate. The conventional p-type floating gate layer may be formed between device isolation regions via a SAG (Self Align Gate) process.

However, the use of a conventional SAG process may cause formation of ridges or voids in the p-type floating gate layer during manufacturing thereof and, thereby, degrade the overall electrical operation of the nonvolatile memory device.

Accordingly, there exists a need for an improved nonvolatile memory device with improved electrical operation and method of manufacturing the same.

SUMMARY OF THE INVENTION

The present invention is therefore directed to a nonvolatile memory device with improved operating characteristics and a method of manufacturing the same, which substantially overcome one or more of the problems due to the limitations and disadvantages of the related art.

It is therefore a feature of an embodiment of the present invention to provide a nonvolatile memory device having improved electrical operation.

It is another feature of an embodiment of the present invention to provide a nonvolatile memory device having a structure capable of reducing ridges and voids in a floating gate thereof.

It is yet another feature of an embodiment of the present invention to provide a method of manufacturing a nonvolatile memory device having one or more of the above features.

At least one of the above and other features of the present invention may be realized by providing a method of manufacturing a nonvolatile memory device, including forming a plurality of device isolation regions in a semiconductor substrate, forming a tunneling insulation layer on the semiconductor substrate, forming a first preliminary polysilicon layer in communication with the tunneling insulation layer and the device isolation regions, forming a preliminary amorphous silicon layer on the first preliminary silicon layer, forming a second preliminary polysilicon layer on the preliminary amorphous silicon layer, and patterning the second preliminary polysilicon layer, the preliminary amorphous silicon layer, and the first preliminary polysilicon layer to form a floating gate layer.

Forming the first preliminary polysilicon layer may include forming a polysilicon layer doped with boron. Forming the polysilicon layer doped with boron may include employing boron trichloride gas ($BCl_3$) and silane gas ($SiH_4$). Forming the polysilicon layer doped with boron may include doping at a temperature of about 400° C. to about 550° C. The polysilicon layer doped with boron may be formed at a temperature of about 520° C.

Forming the second preliminary polysilicon layer may include diffusing boron into the second preliminary polysilicon layer. The preliminary amorphous silicon layer may be formed at a temperature of about 450° C. to about 550° C. The preliminary amorphous silicon layer may be formed at a temperature of about 520° C.

The second preliminary polysilicon layer may be formed at a temperature of about 530° C. to about 620° C. The first preliminary polysilicon layer and the preliminary amorphous silicon layer may be formed in the same chamber. Forming the preliminary amorphous silicon layer may include etchback processing.

The plurality of device isolation regions may include processing the device isolation regions to protrude from the semiconductor substrate. Forming of the device isolation layer may include forming a mask pattern on the semiconductor substrate, forming a plurality of trenches in the semiconductor substrate, filling the plurality of trenches with an insulating layer, planarizing the insulating layer, and removing the mask pattern.

Forming the floating gate layer may include planarizing the second preliminary polysilicon layer by a SAG process. The inventive method may further include forming an inter-gate insulating layer and a control gate layer on the inter-gate insulating layer.

In another aspect of the present invention, there is provided a nonvolatile memory device, including a semiconductor substrate; a tunneling insulation layer on the semiconductor substrate; a floating gate layer on the tunneling insulation layer, the floating gate including a first polysilicon layer, an amorphous silicon layer, and a second polysilicon layer; an inter-gate insulating layer on the floating gate layer; and a control gate layer on the inter-gate insulating layer. The floating gate layer may include a p-type impurity. The p-type impurity may be boron.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
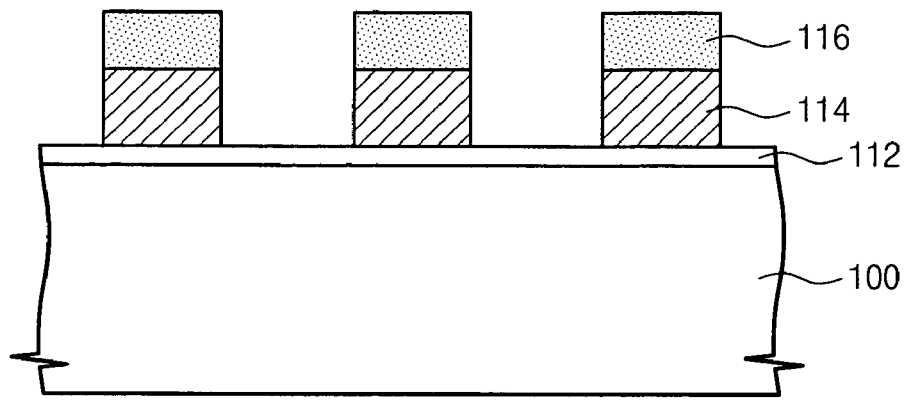
FIGS. 1A through 1H illustrate sequential steps of a method of manufacturing a nonvolatile memory device according to an embodiment of the present invention.

Korean Patent Application No. 2006-100433, filed on Oct. 16, 2006, in the Korean Intellectual Property Office, and entitled: "Nonvolatile Memory Device and Method of Manufacturing the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a method of manufacturing a nonvolatile memory device of the present invention will now be more fully described with respect to FIGS. 1A-1H.

As illustrated in FIG. 1A, a pad oxide layer 112 may be formed on a semiconductor substrate 100. The pad oxide layer 112 may include a silicon oxide layer that may be formed by thermal oxidation. A hard mask layer (not shown) may be formed on the pad oxide layer 112 by depositing a silicon nitride layer via chemical vapor deposition (CVD) thereon. A photoresist pattern 116 may be formed on the hard mask layer to facilitate formation of a hard mask pattern 114 in an etching process, while using the photoresist pattern 116 as an etch mask.

Figure 1B:
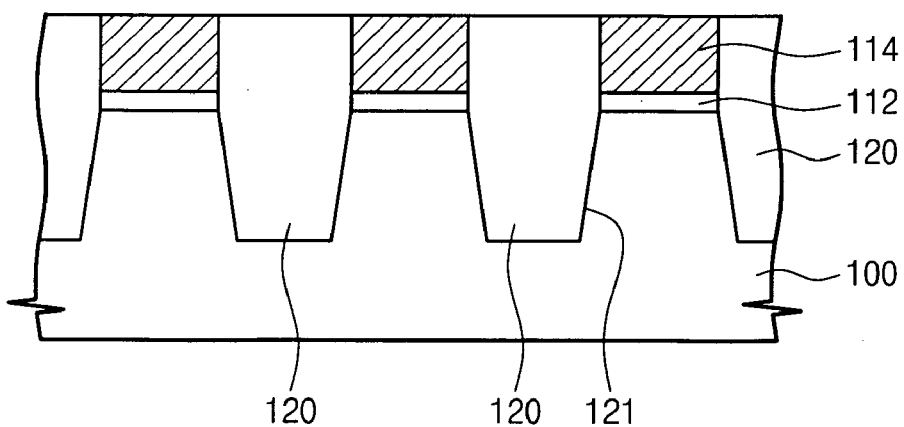

Referring to FIG. 1B, the hard mask pattern 114 may be used as an etch mask in an etching process to form a plurality of trenches 121 in the semiconductor substrate 100. An insulating layer may be deposited by high-density plasma CVD (HDPCVD) to fill the trenches 121. The insulating layer may be planarized to expose a top surface of the hard mask pattern 114, as illustrated in FIG. 1B. The trenches 121 filled with the insulating layer may form device isolation regions 120, thereby defining an active region.

Figure 1C:
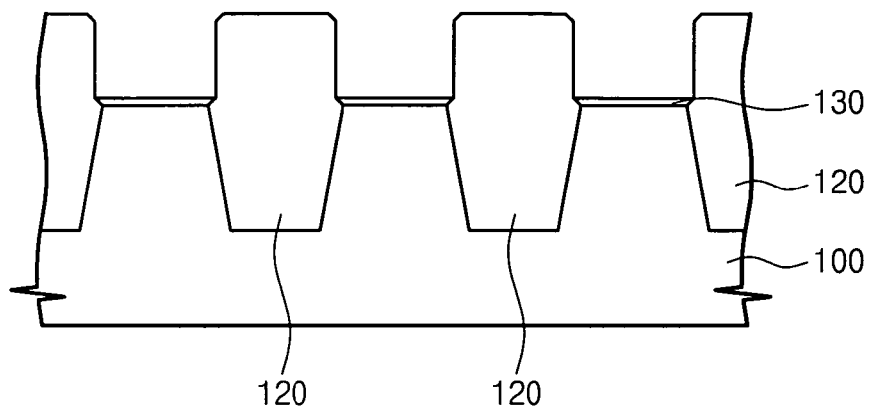

Referring to FIG. 1C, the hard mask pattern 114 and the pad oxide layer 112 may be removed to expose portions of an upper surface of the semiconductor substrate 100, such that portions of the device isolation regions 120 may protrude in an upward direction and alternating pattern from the exposed semiconductor substrate 100. In other words, each exposed portion of the substrate 100 may be positioned between two protruding portions of the device isolation regions 120. Removal of the hard mask pattern 114 may include performing a wet etching process using a phosphoric acid ($H_3PO_4$)-containing solution. Removal of the pad oxide layer 112 may include performing a wet etching process using a hydrofluoric acid (HF)-containing solution. As further illustrated in FIG. 1C, a tunneling insulation layer 130 may be formed on the exposed portions of the semiconductor substrate 100 by depositing a silicon oxide layer thereon via thermal oxidation.

Figure 1D:
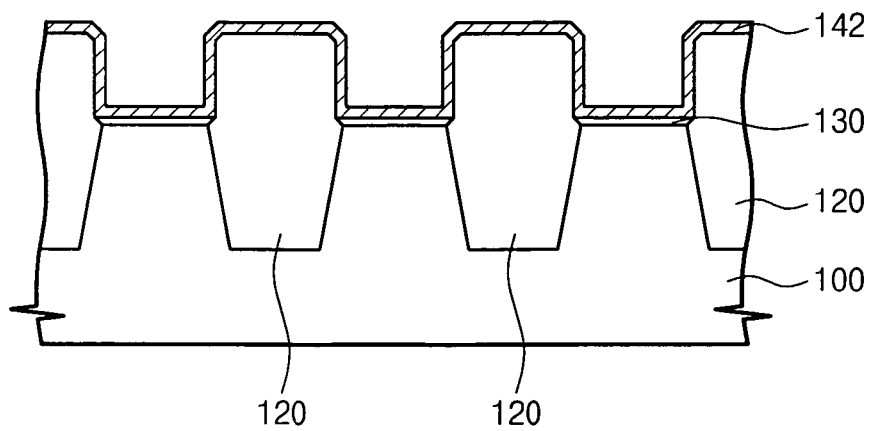

Referring to FIG. 1D, a first preliminary polysilicon layer 142 may be formed on the tunneling insulation layer 130 and on the device isolation regions 120. In other words, the first preliminary polysilicon layer 142 may be in continuous communication with an outer surface of the tunneling insulation layer 130 and on the device isolation regions 120, such that no portions of the tunneling insulation layer 130 or the device isolation regions 120 may be in contact with the exterior. The first preliminary polysilicon layer 142 may be formed to a thickness of, for example, about 200 angstroms. Formation of the first preliminary polysilicon layer 142 may include forming a polysilicon layer doped with boron (B).

Doping of a polysilicon layer with boron may include providing simultaneously trichloride gas ($BCl_3$) and silane gas ($SiH_4$) thereto at a temperature of about 400° C. to about 550° C. In this respect, it should be noted that a polysilicon layer formed at a temperature of about 520° C. may contain lower-concentration of boron than a polysilicon layer formed at a temperature of about 450° C., thereby providing increased speeds of program/erase operations of a nonvolatile memory device.

Figure 1E:
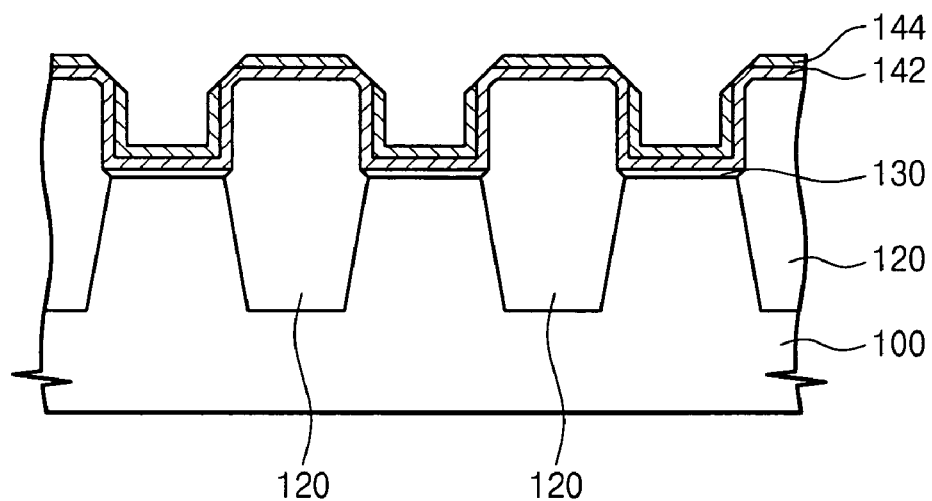

Referring to FIG. 1E, a preliminary amorphous silicon layer 144 may be formed on the first preliminary polysilicon layer 142, such that a continuous contact may be formed therebetween. The first preliminary polysilicon layer 142 and the preliminary amorphous silicon layer 144 may be formed in the same chamber. The preliminary amorphous silicon layer 144 may be formed at a temperature of about 450° C. to about 550° C., e.g., a temperature of about 520° C., to a thickness of, for example, 150 angstroms. In this respect, it should be noted that the preliminary amorphous silicon layer 144 formed at a temperature of about 520° C. may have an excellent surface morphology. An etch-back process may be performed to remove a portion of the preliminary amorphous silicon layer 144, as illustrated in FIG. 1E, in order to minimize deformation, e.g., narrowing or closing, of an upper surface thereof upon high integration of the nonvolatile memory device.

Figure 1F:
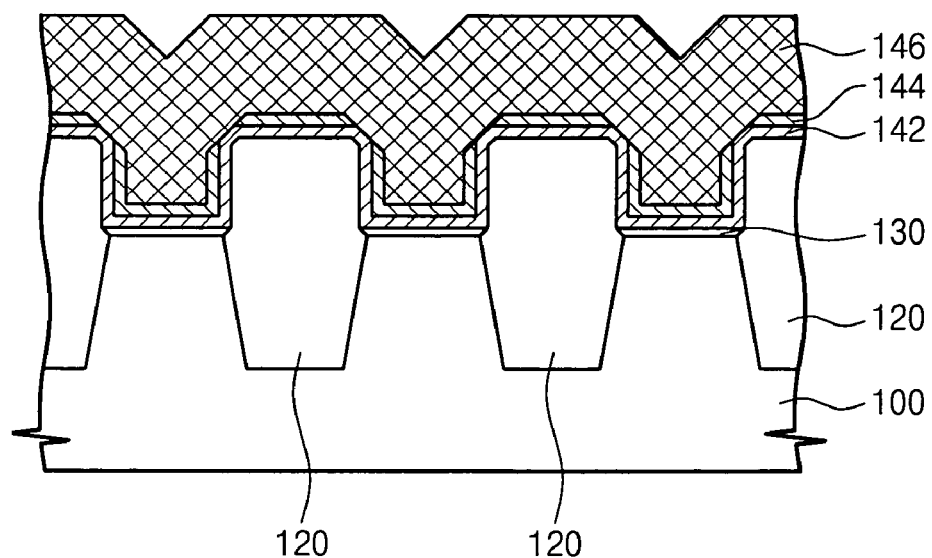

Referring to FIG. 1F, a second preliminary polysilicon layer 146 may be formed at a temperature of about 530° C. to about 620° C. on the preliminary amorphous silicon layer 144, such that a continuous contact may be formed therebetween. Next, a thermal treatment process may be performed on the semiconductor substrate 100 to diffuse p-type impurities, e.g., boron, from the first preliminary polysilicon layer 142 into the second preliminary polysilicon layer 146. The thermal treatment process may be performed in a nitrogen gas environment, e.g., atmospheric pressure at 850° C. for 30 minutes. Without intending to be bound by theory, it is believed that because the preliminary amorphous silicon layer 144 may have an excellent surface morphology, the second preliminary polysilicon layer 146 may have a significantly reduced number of ridges or voids upon formation.

Figure 1G:
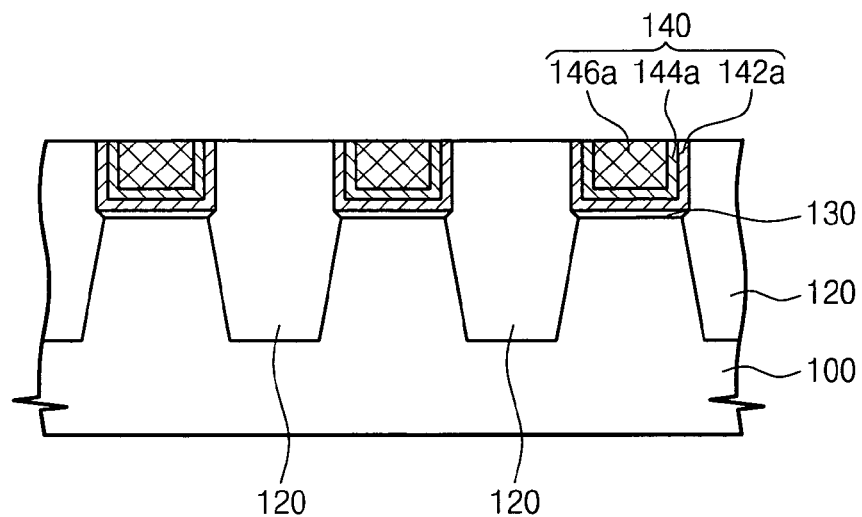

Referring to FIG. 1G, the second preliminary polysilicon layer 146 may be planarized to expose upper surfaces of the device isolation regions 120 by a SAG, i.e., self aligned gate, process. Planarization of the second preliminary polysilicon layer 146 may provide an alternating surface pattern of device isolation regions 120 and surfaces having a plurality of layers, i.e., a first polysilicon layer 142a, an amorphous silicon layer 144a, and a second polysilicon layer 146a, as illustrated in FIG. 1G. The planarized first polysilicon layer 142a, amorphous silicon layer 144a, and second polysilicon layer 146a, i.e., plurality of layers between the device isolation regions 120, may form a floating gate layer 140 on the tunneling insulation layer 130. The floating gate layer 140 may include low concentration of p-type impurities, e.g., boron, diffused by a thermal treatment process, such that the speeds of the program/erase operations of the nonvolatile memory device can be increased. Further the amorphous silicon layer 144a may minimize voids and ridges in the floating gate layer 140.

Figure 1H:
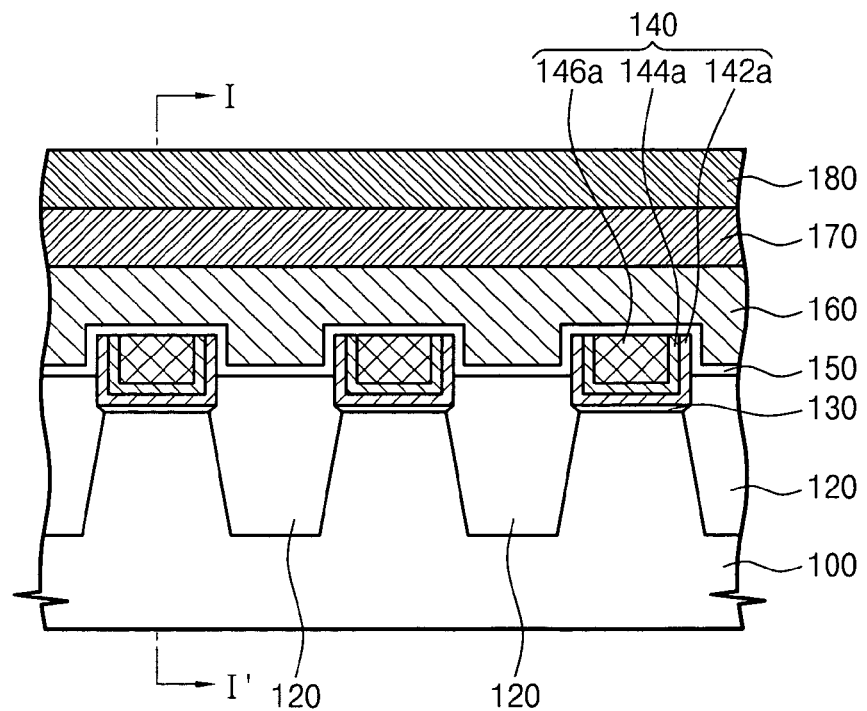

Referring to FIG. 1H, upper portions of the device isolation regions 120 may be recessed, such that a top surface thereof may be lower, i.e., as measured along a vertical direction with respect to an upper surface of the structure illustrated in FIG. 1G, than a top surface of the floating gate layer 140. The recessing of the device isolation regions 120 may increase a coupling ratio, i.e., a ratio of an operating voltage applied across a control gate layer to a voltage induced at a floating gate layer by the operating voltage. Additionally, the recessing of the device isolation regions 120 can increase the capacitance between the floating gate layer 140 and a control gate layer 160 that will be described below.

An inter-gate insulating layer 150 may be formed on the recessed device isolation layer 120 and the floating gate layer 140. The inter-gate insulating layer 150 may include an ONO (oxide-nitride-oxide) layer that may be formed by CVD. A control gate layer 160 may be formed on the inter-gate insulating layer 150. The control gate layer 160 may include a polysilicon layer that may be formed by CVD. A metal silicide layer 170 may be formed on the control gate layer 160 by depositing, for example, a cobalt (Co) layer on the polysilicon layer of the control gate layer 160 and, subsequently, removing cobalt that has failed to react with the polysilicon layer. Finally, a hard mask layer 180 may be formed on the metal silicide layer 170 by depositing a silicon nitride layer or a silicon oxide layer thereon via CVD.

Figure 2:
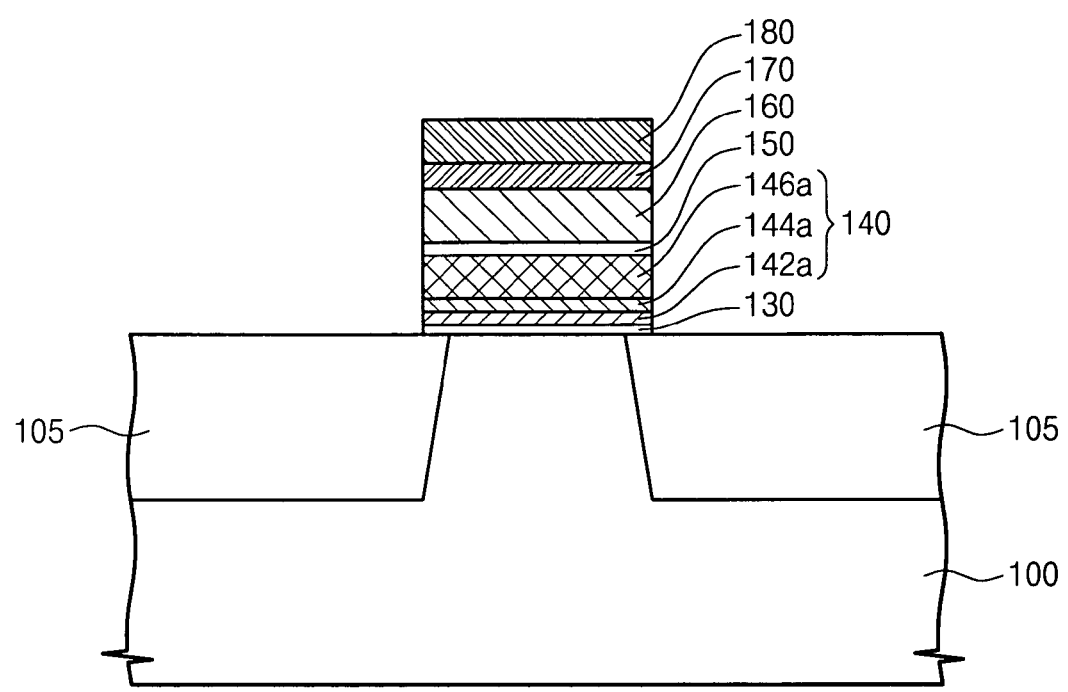
FIG. 2 illustrates a cross-sectional view along line I-I' of FIG. 1H.

A cross-section of the nonvolatile memory device prepared according to the exemplary method described with respect to FIGS. 1A-1H is illustrated in FIG. 2, i.e., a cross-section taken along line I-I' of FIG. 1H. Accordingly, a nonvolatile memory device according to an embodiment of the present invention may include a semiconductor substrate 100, a tunneling insulation layer 130 on the semiconductor substrate 100, a floating gate layer 140 on the tunneling insulation layer 130, an inter-gate insulating layer 150 on the floating gate layer 140, a control gate layer 160 on the inter-gate insulating layer 150, a metal silicide layer 170 on the control gate layer 160, and a hard mask layer 180 on the metal silicide layer 170.

The floating gate layer 140 may include a first polysilicon layer 142a on the tunneling insulation layer 130, an amorphous silicon layer 144a on the first polysilicon layer 142a, and a second polysilicon layer 146a on the amorphous silicon layer 144a. The floating gate layer 140 may include low-concentration p-type impurities, e.g., boron (B). The boron p-type impurities of the floating gate layer 140 may be impurities diffused from the first polysilicon layer 142a.

As described above, the nonvolatile memory device according to an exemplary embodiment of the present invention may have a p-type floating gate layer. Formation of the p-type impurities of the floating gate layer at low concentrations may increase the speeds of the program/erase operations of the nonvolatile memory device. In addition, because the amorphous silicon layer has an excellent surface morphology, the floating gate layer may have a significantly reduced number of ridges and/or voids.

Accordingly, it is possible to form a nonvolatile memory device with improved operating characteristics.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a nonvolatile memory device, comprising:
    forming a plurality of device isolation regions in a semiconductor substrate;
    forming a tunneling insulation layer on the semiconductor substrate;
    forming a first preliminary polysilicon layer in communication with the tunneling insulation layer and the device isolation regions;
    forming a preliminary amorphous silicon layer on the first preliminary silicon layer;
    forming a second preliminary polysilicon layer on the preliminary amorphous silicon layer; and
    patterning the second preliminary polysilicon layer, the preliminary amorphous silicon layer, and the first preliminary polysilicon layer to form a floating gate layer;
    wherein forming the first preliminary polysilicon layer includes forming a polysilicon layer doped with boron.

2. The method as claimed in claim 1, wherein forming the polysilicon layer doped with boron includes employing boron trichloride gas ($BCl_3$) and silane gas ($SiH_4$).

3. The method as claimed in claim 1, wherein forming the polysilicon layer doped with boron includes doping at a temperature of about 400° C. to about 550° C.

4. The method as claimed in claim 3, wherein the polysilicon layer doped with boron is formed at a temperature of about 520° C.

5. The method as claimed in claim 1, wherein forming the second preliminary polysilicon layer includes diffusing boron into the second preliminary polysilicon layer by a thermal treatment.

6. The method as claimed in claim 1, wherein the second preliminary polysilicon layer is formed at a temperature of about 530° C. to about 620° C.

7. The method as claimed in claim 1, wherein the preliminary amorphous silicon layer is formed at a temperature of about 450° C. to about 550° C.

8. The method as claimed in claim 6, wherein the preliminary amorphous silicon layer is formed at a temperature of about 520° C.

9. A method of manufacturing a nonvolatile memory device, comprising:
    forming a plurality of device isolation regions in a semiconductor substrate;
    forming a tunneling insulation layer on the semiconductor substrate;
    forming a first preliminary polysilicon layer in communication with the tunneling insulation layer and the device isolation regions;
    forming a preliminary amorphous silicon layer on the first preliminary silicon layer;
    forming a second preliminary polysilicon layer on the preliminary amorphous silicon layer; and
    patterning the second preliminary polysilicon layer, the preliminary amorphous silicon layer, and the first preliminary polysilicon layer to form a floating gate layer,
    wherein forming the preliminary amorphous silicon layer includes etch-back processing.

10. The method as claimed in claim 1, wherein the first preliminary polysilicon layer and the preliminary amorphous silicon layer are formed in a same chamber.

11. The method as claimed in claim 1, wherein forming the plurality of device isolation regions includes processing the device isolation regions to protrude from the semiconductor substrate.

12. The method as claimed in claim 1, wherein forming the device isolation regions includes forming a mask pattern on the semiconductor substrate, forming a plurality of trenches in the semiconductor substrate, filling the plurality of trenches with an insulating layer, planarizing the insulating layer, and removing the mask pattern.

13. A method of manufacturing a nonvolatile memory device, comprising:
- forming a plurality of device isolation regions in a semiconductor substrate;
- forming a tunneling insulation layer on the semiconductor substrate;
- forming a first preliminary polysilicon layer in communication with the tunneling insulation layer and the device isolation regions;
- forming a preliminary amorphous silicon layer on the first preliminary silicon layer;
- forming a second preliminary polysilicon layer on the preliminary amorphous silicon layer; and
- patterning the second preliminary polysilicon layer, the preliminary amorphous silicon layer, and the first preliminary polysilicon layer to form a floating gate layer,
- wherein forming the floating gate layer includes planarizing the second preliminary polysilicon layer by a SAG process.

14. The method as claimed in claim 1, further comprising forming an inter-gate insulating layer and forming a control gate layer on the inter-gate insulating layer.

15. The method as claimed in claim 1, wherein forming the preliminary amorphous silicon layer includes etch-back processing.

16. The method as claimed in claim 1, wherein forming the floating gate layer includes planarizing the second preliminary polysilicon layer by a SAG process.

17. The method as claimed in claim 9, wherein the first preliminary polysilicon layer and the preliminary amorphous silicon layer are formed in a same chamber.

18. The method as claimed in claim 9, wherein forming the floating gate layer includes planarizing the second preliminary polysilicon layer by a SAG process.

19. The method as claimed in claim 13, wherein the first preliminary polysilicon layer and the preliminary amorphous silicon layer are formed in a same chamber.

20. The method as claimed in claim 19, wherein forming the preliminary amorphous silicon layer includes etch-back processing.

* * * * *